(12) United States Patent
Yan et al.

(10) Patent No.: US 11,307,468 B2
(45) Date of Patent: Apr. 19, 2022

(54) ARRAY SUBSTRATE AND MANUFACTURING METHOD THEREOF

(71) Applicant: Wuhan China Star Optoelectronics Technology Co., Ltd., Wuhan (CN)

(72) Inventors: Yuan Yan, Wuhan (CN); Yong Xu, Wuhan (CN); Dewei Song, Wuhan (CN); Fei Ai, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 140 days.

(21) Appl. No.: 16/754,332

(22) PCT Filed: Nov. 11, 2019

(86) PCT No.: PCT/CN2019/116957
§ 371 (c)(1),
(2) Date: Apr. 7, 2020

(87) PCT Pub. No.: WO2021/031392
PCT Pub. Date: Feb. 25, 2021

(65) Prior Publication Data
US 2022/0004066 A1    Jan. 6, 2022

(30) Foreign Application Priority Data
Aug. 20, 2019   (CN) .......................... 201910768360.9

(51) Int. Cl.
*G02F 1/1362*   (2006.01)
*H01L 27/12*    (2006.01)
*G02F 1/1333*   (2006.01)
*G06F 3/041*    (2006.01)
*G02F 1/1343*   (2006.01)

(52) U.S. Cl.
CPC .... *G02F 1/136236* (2021.01); *G02F 1/13338* (2013.01); *G02F 1/13439* (2013.01); *G06F 3/0412* (2013.01); *H01L 27/1288* (2013.01); *G06F 2203/04103* (2013.01)

(58) Field of Classification Search
CPC . H01L 27/1288; H01L 27/124; G06F 3/0412; G06F 2203/04103
USPC .......................................................... 349/12
See application file for complete search history.

(56) References Cited

U.S. PATENT DOCUMENTS

2018/0188584 A1*   7/2018   Yeh .................. G02F 1/1337

* cited by examiner

*Primary Examiner* — Charles S Chang
(74) *Attorney, Agent, or Firm* — Kirton McConkie; Evan R. Witt

(57) ABSTRACT

The present disclosure provides an array substrate and a manufacturing method of the array substrate. The method includes sequentially forming an active layer and an insulating layer on a substrate; forming a common electrode layer and a first metal layer on the insulating layer using a same photomask, wherein the common electrode layer includes touch electrodes; and forming a second metal layer on the pixel electrode layer, wherein the second metal layer includes touch signal lines, and the touch signal lines electrically are electrically connected to the touch electrodes.

15 Claims, 5 Drawing Sheets

ARRAY SUBSTRATE AND
MANUFACTURING METHOD THEREOF

FIELD OF INVENTION

The present disclosure relates to the field of display technologies, and particularly relates to an array substrate and a manufacturing method of the array substrate.

BACKGROUND OF INVENTION

With the development of integrated touch display panels, people have higher and higher requirements for high resolution. Therefore, a fine active driving matrix (an array substrate) is required to align with deflection of liquid crystals in each pixel area.

However, a method for manufacturing a touch-integrated array substrate in the prior art has complicated steps, high production costs, and long cycles.

SUMMARY OF INVENTION

Embodiments of the present disclosure provide an array substrate and a manufacturing method of the array substrate, so as to solve the technical problems of complicated steps, high production costs, and long cycles in a conventional manufacturing method of the touch-integrated array substrate.

Embodiments of the present disclosure provide a manufacturing method of an array substrate, including:

providing a substrate;

forming a patterned active layer on the substrate;

forming an insulating layer on the active layer;

forming a patterned common electrode layer and a patterned first metal layer on the insulating layer using a same photomask, wherein the patterned common electrode layer includes touch electrodes;

forming a patterned protective layer and a patterned pixel electrode layer on the first metal layer using a same photomask, wherein the patterned pixel electrode layer includes pixel electrodes; and forming a patterned second metal layer on the pixel electrode layer, wherein the patterned second metal layer includes drain electrodes and touch signal lines, the drain electrodes are electrically connected to the pixel electrodes, and the touch signal lines are electrically connected to the touch electrodes;

wherein the step of forming the patterned common electrode layer and the patterned first metal layer on the insulating layer using the same photomask includes:

sequentially forming the common electrode layer, the first metal layer, and a first photoresist layer on the insulating layer;

exposing the first photoresist layer by a first half-tone photomask and then exposing the first photoresist layer to form a patterned first photoresist layer, wherein the patterned first photoresist layer includes a first portion corresponding to a gate portion to be formed in the first metal layer, a second portion corresponding to a portion of the touch electrodes to be formed in the common electrode layer, and a first through hole corresponding to a source/drain area of the active layer; and a thickness of the first portion is greater than a thickness of the second portion;

using the patterned first photoresist layer as a mask to etch the common electrode layer and the first metal layer by a wet etching process to form a gate electrode;

performing heavy doping on the active layer through the first through hole;

ashing the patterned first photoresist layer to thin the first portion and remove the second portion;

removing exposed parts of the first metal layer by etching;

removing remaining parts of the first photoresist layer; and performing light doping on the active layer.

In the manufacturing method of the array substrate of the present disclosure, the first half-tone photomask includes a first light transmitting portion and a second light transmitting portion, a light transmittance of the first light transmitting portion is greater than a light transmittance of the second light transmitting portion, the light transmittance of the first light transmitting portion is 100%, the first light transmitting portion is disposed corresponding to the source/drain area of the active layer, and the second light transmitting portion is disposed corresponding to a portion of the touch electrodes to be formed in the common electrode layer.

In the manufacturing method of the array substrate of the present disclosure, the step of forming the patterned protective layer and the patterned pixel electrode layer on the first metal layer using the same photomask includes:

sequentially forming the protective layer, the pixel electrode layer, and a second photoresist layer on the first metal layer;

exposing the second photoresist layer by a second half-tone photomask and then exposing the second photoresist layer to form a patterned second photoresist layer, wherein the patterned second photoresist layer includes a second through hole corresponding to the source/drain area of the active layer, a third through hole corresponding to the touch electrodes, a third portion corresponding to a portion of the pixel electrodes to be formed in the pixel electrode layer, and a fourth portion corresponding to a portion to be removed in the pixel electrode layer; and a thickness of the third portion is greater than a thickness of the fourth portion;

using the patterned second photoresist layer as a mask to sequentially etch the pixel electrode layer and the protective layer to expose the source/drain area of the active layer through the second through hole and expose the touch electrodes through the third through hole;

ashing the patterned second photoresist layer to thin the third portion and remove the fourth portion;

etching the pixel electrode layer to remove its exposed parts so as to form the patterned pixel electrode layer; and removing remaining parts of the second photoresist layer.

In the manufacturing method of the array substrate of the present disclosure, the second half-tone photomask includes a third light transmitting portion and a fourth light transmitting portion, a light transmittance of the third light transmitting portion is greater than a light transmittance of the fourth light transmitting portion, the light transmittance of the third light transmitting portion is 100%, the third light transmitting portion is disposed corresponding to the source/drain area of the active layer and the touch electrodes, and the fourth light transmitting portion is disposed corresponding to parts of the pixel electrode layer to be removed.

In the manufacturing method of the array substrate of the present disclosure, the step of using the patterned second photoresist layer as the mask to sequentially etch the pixel electrode layer and the protective layer includes etching the pixel electrode layer by a wet etching process and etching the protective layer by a dry etching process.

Embodiments of the present disclosure also provide a manufacturing method of an array substrate, including:

providing a substrate;

forming a patterned active layer on the substrate;

forming an insulating layer on the active layer;

forming a patterned common electrode layer and a patterned first metal layer on the insulating layer using a same photomask, wherein the patterned common electrode layer includes touch electrodes;

forming a patterned protective layer and a patterned pixel electrode layer on the first metal layer, wherein the patterned pixel electrode layer includes pixel electrodes; and forming a patterned second metal layer on the pixel electrode layer, wherein the patterned second metal layer includes drain electrodes and touch signal lines, the drain electrodes are electrically connected to the pixel electrodes, and the touch signal lines are electrically connected to the touch electrodes.

In the manufacturing method of the array substrate of the present disclosure, the step of forming the patterned common electrode layer and the patterned first metal layer on the insulating layer using the same photomask includes:

sequentially forming the common electrode layer, the first metal layer, and a first photoresist layer on the insulating layer;

exposing the first photoresist layer by a first half-tone photomask, and then exposing the first photoresist layer to form a patterned first photoresist layer, wherein the patterned first photoresist layer includes a first portion corresponding to a gate portion to be formed in the first metal layer, a second portion corresponding to a portion of the touch electrodes to be formed in the common electrode layer, and a first through hole corresponding to a source/drain area of the active layer; and a thickness of the first portion is greater than a thickness of the second portion;

using the patterned first photoresist layer as a mask to etch the common electrode layer and the first metal layer by a wet etching process to form a gate electrode;

performing heavy doping on the active layer through the first through hole;

ashing the patterned first photoresist layer to thin the first portion and remove the second portion;

removing exposed parts of the first metal layer by etching;

removing remaining parts of the first photoresist layer; and performing light doping on the active layer.

In the manufacturing method of the array substrate of the present disclosure, the first half-tone photomask includes a first light transmitting portion and a second light transmitting portion, a light transmittance of the first light transmitting portion is greater than a light transmittance of the second light transmitting portion, the light transmittance of the first light transmitting portion is 100%, the first light transmitting portion is disposed corresponding to the source/drain area of the active layer, and the second light transmitting portion is disposed corresponding to a portion of the touch electrodes to be formed in the common electrode layer.

In the manufacturing method of the array substrate of the present disclosure, the patterned protective layer and the patterned pixel electrode layer are formed on the first metal layer using a same photomask.

In the manufacturing method of the array substrate of the present disclosure, the step of forming the patterned protective layer and the patterned pixel electrode layer on the first metal layer using a same photomask includes:

sequentially forming the protective layer, the pixel electrode layer, and a second photoresist layer on the first metal layer;

exposing the second photoresist layer by a second half-tone photomask and then exposing the second photoresist layer to form a patterned second photoresist layer, wherein the patterned second photoresist layer includes a second through hole corresponding to a source/drain area of the active layer, a third through hole corresponding to the touch electrodes, a third portion corresponding to a portion of the pixel electrodes to be formed in the pixel electrode layer, and a fourth portion corresponding to a portion to be removed in the pixel electrode layer; and a thickness of the third portion is greater than a thickness of the fourth portion;

using the patterned second photoresist layer as a mask to sequentially etch the pixel electrode layer and the protective layer to expose the source/drain area of the active layer through the second through hole and expose the touch electrodes through the third through hole;

ashing the patterned second photoresist layer to thin the third portion and remove the fourth portion;

etching the pixel electrode layer to remove its exposed parts so as to form the patterned pixel electrode layer; and removing remaining parts of the second photoresist layer.

In the manufacturing method of the array substrate of the present disclosure, the second half-tone photomask includes a third light transmitting portion and a fourth light transmitting portion, a light transmittance of the third light transmitting portion is greater than a light transmittance of the fourth light transmitting portion, the light transmittance of the third light transmitting portion is 100%, the third light transmitting portion is disposed corresponding to the source/drain area of the active layer and the touch electrodes, and the fourth light transmitting portion is disposed corresponding to parts of the pixel electrode layer to be removed.

In the manufacturing method of the array substrate of the present disclosure, the step of using the patterned second photoresist layer as the mask to sequentially etch the pixel electrode layer and the protective layer includes etching the pixel electrode layer by a wet etching process and etching the protective layer by a dry etching process.

In the manufacturing method of the array substrate of the present disclosure, both of the common electrode layer and the pixel electrode layer are transparent conductive layers.

In the manufacturing method of the array substrate of the present disclosure, the transparent conductive layer is made of indium tin oxide.

The present disclosure also relates to an array substrate including a substrate and an active layer, an insulating layer, a common electrode layer, a first metal layer, a protective layer, a pixel electrode layer, and a second metal layer sequentially disposed on the substrate;

wherein the pixel electrode layer includes pixel electrodes; the second metal layer includes drain electrodes and touch signal lines; the common electrode layer includes touch electrodes; the drain electrodes are electrically connected to the pixel electrodes; and the touch signal lines are electrically connected to the touch electrodes.

In the array substrate of the present disclosure, the common electrode layer further includes a first base portion disposed on a same layer as the touch electrodes, and the first metal layer is stacked on the first base portion.

In the array substrate of the present disclosure, the pixel electrode layer further includes a second base portion disposed on a same layer as the pixel electrodes, the second metal layer includes source electrodes, and the source electrodes are stacked on the second base portion.

Compared with a conventional array substrate and a conventional manufacturing method of the array substrate, the manufacturing method of the array substrate of the present disclosure uses a same photomask to form a patterned common electrode layer and a patterned first metal layer, which not only saves a photomask, but also saves a light shielding layer; and thereby solving the technical problems of complicated steps, high production costs, and long cycles in the conventional manufacturing method of the touch-integrated array substrate.

DESCRIPTION OF DRAWINGS

In order to more clearly illustrate the technical solutions in the embodiments or in prior art, the drawings to be used in the descriptions of the embodiments or the prior art will be briefly described below. Obviously, the drawings in the following description are merely embodiments of the present disclosure. For those of ordinary skill in the art, other drawings may be obtained from the drawings without any creative work.

DETAILED DESCRIPTION OF EMBODIMENTS

Please refer to the drawings, wherein the same component symbols represent the same components. The following description is based on exemplified specific embodiments of the present disclosure, which should not be construed as limiting other specific embodiments that are not detailed herein.

Figure 1:
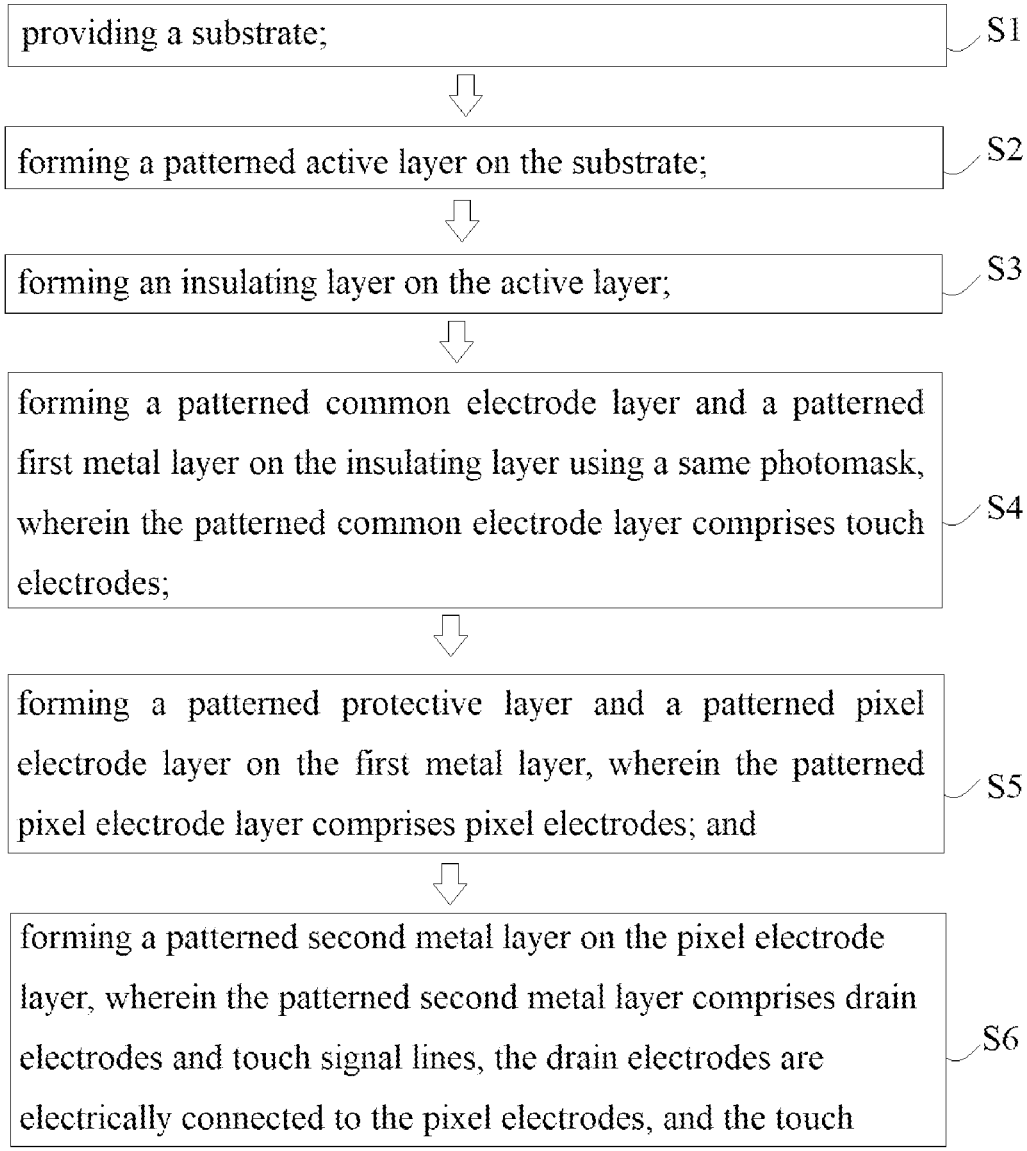
FIG. 1 is a process diagram of a manufacturing method of an array substrate of an embodiment according to the present disclosure.
Figure 2:
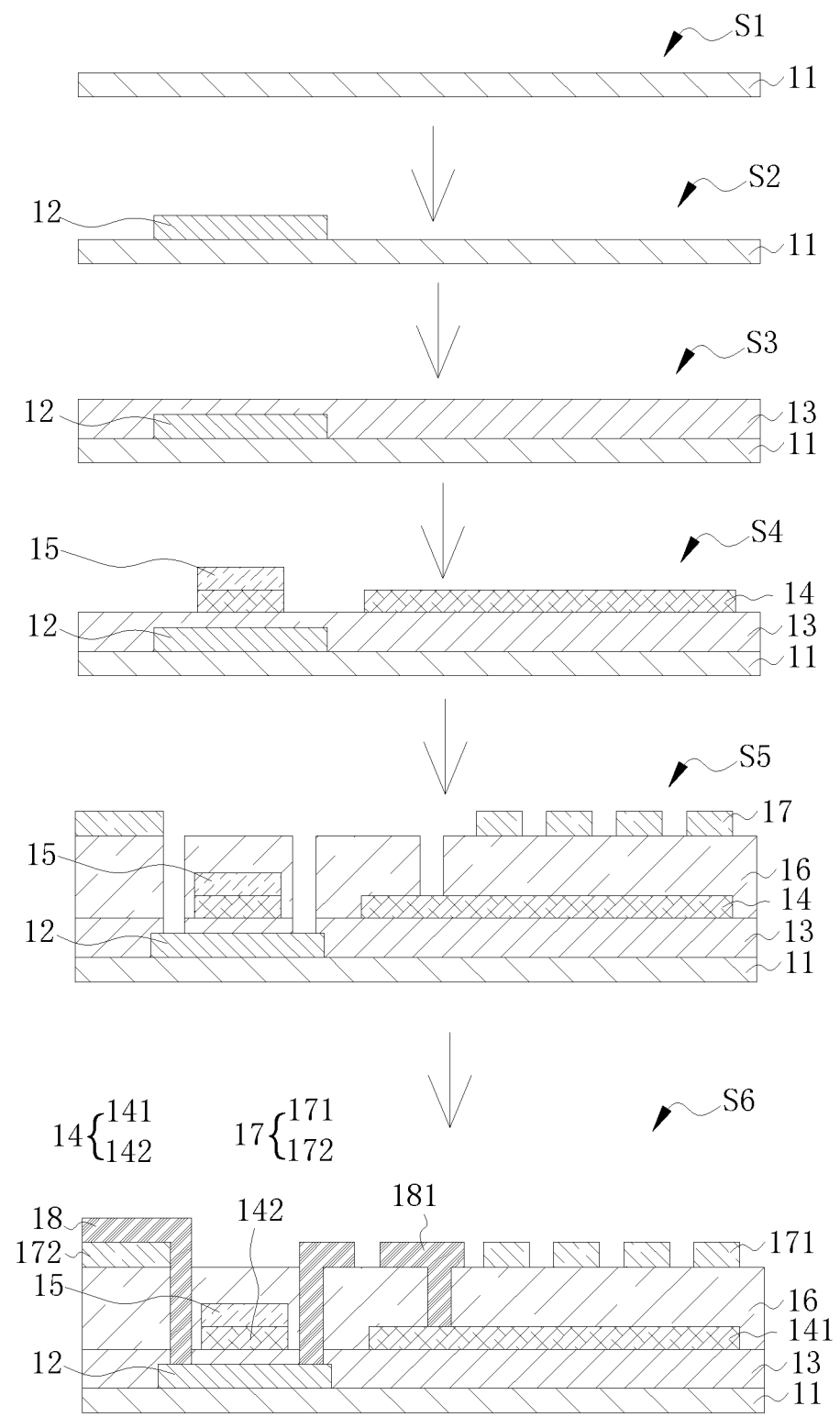
FIG. 2 is a schematic diagram of the manufacturing method of the array substrate of the embodiment according to the present disclosure.

Referring to FIG. 1 and FIG. 2, FIG. 1 is a process diagram of a manufacturing method of an array substrate of an embodiment according to the present disclosure, and FIG. 2 is a schematic diagram of the manufacturing method of the array substrate of the embodiment according to the present disclosure.

The embodiment of the present disclosure provides a manufacturing method of an array substrate which includes the following steps:

Step S1: providing a substrate 11;

Step S2: forming a patterned active layer 12 on the substrate 11;

Step S3: forming an insulating layer 13 on the active layer 12;

Step S4: forming a patterned common electrode layer 14 and a patterned first metal layer 15 on the insulating layer 13 using a same photomask, wherein the patterned common electrode layer 14 includes touch electrodes;

Step S5: forming a patterned protective layer 16 and a patterned pixel electrode layer 17 on the first metal layer 15, wherein the patterned pixel electrode layer 17 includes pixel electrodes;

Step S6: forming a patterned second metal layer 18 on the pixel electrode layer 17, wherein the patterned second metal layer 18 includes drain electrodes and touch signal lines 181, and the drain electrodes are electrically connected to the pixel electrodes, and the touch signal lines 181 are electrically connected to the touch electrodes.

The manufacturing method of the array substrate of the present disclosure uses a same photomask to form the patterned common electrode layer 14 and the patterned first metal layer 15, which not only saves a photomask, but also saves a light shielding layer. The manufacturing method of the array substrate of an embodiment according to the present disclosure is described in detail below.

In step S1, a substrate 11 is provided. The substrate 11 is a is a rigid substrate, optionally, a glass substrate, but is not limited thereto. Then proceed step S2.

In step S2, a patterned active layer 12 is formed on the substrate 11. An amorphous silicon layer is first provided on the substrate 11; then the amorphous silicon layer is treated by laser annealing to form a polysilicon layer; and the polysilicon layer is lastly patterned using a photomask to form a patterned low-temperature polysilicon layer, that is, the patterned active layer 12 is formed.

In this embodiment, a light shielding layer for shielding the active layer 12 is saved. Since the light shielding layer is saved, a ratio of doping ions of a source/drain area of the active layer 12 needs to be adjusted to overcome a weak electrical property generated by the active layer after being illuminated. Wherein, a doping process is performed in step S4. Then proceed step S3.

In step S3, an insulating layer 13 is formed on the active layer 12. Then proceed step S4.

In step S4, a patterned common electrode layer 14 and a patterned first metal layer 15 are formed on the insulating layer 13 using a same photomask, and the patterned common electrode layer 14 includes touch electrodes 141.

Figure 3:
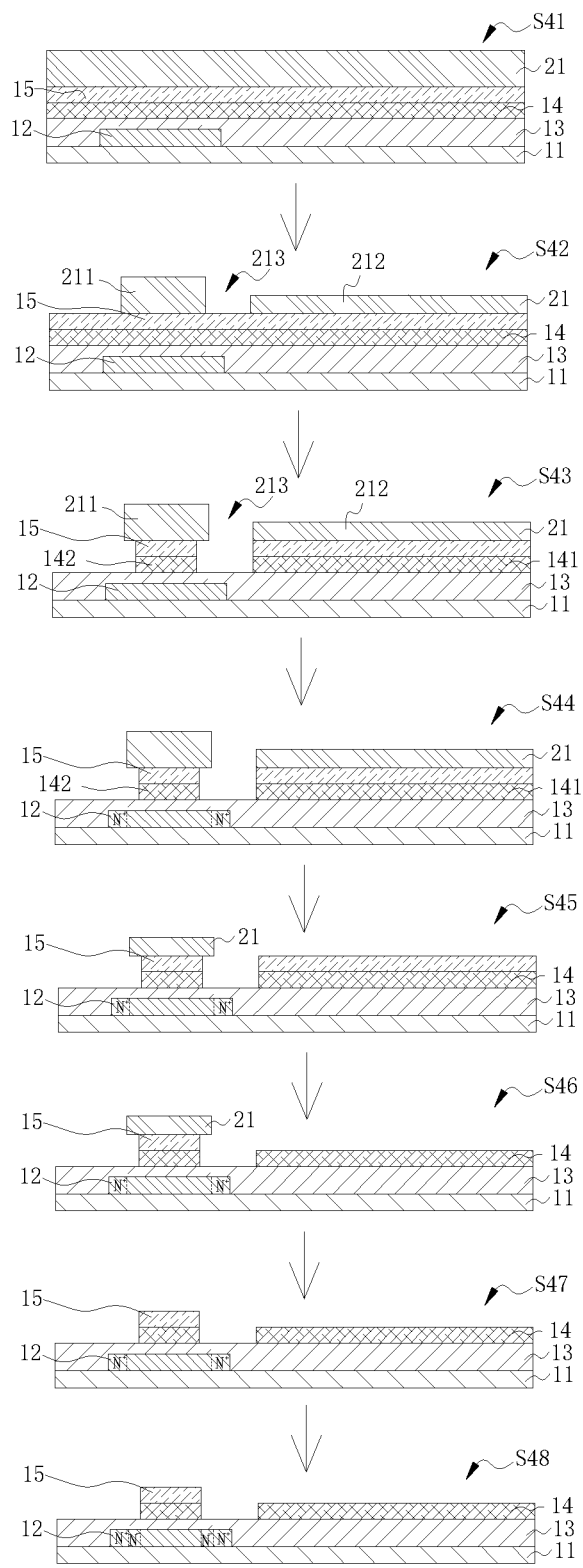
FIG. 3 is a schematic diagram of step S4 of the manufacturing method of the array substrate of the embodiment according to the present disclosure.

Specifically, referring to FIG. 3, it is a schematic diagram of the step S4 of the manufacturing method of the array substrate of the embodiment according to the present disclosure.

The step S4 includes the following steps:

S41: sequentially forming a common electrode layer 14, a first metal layer 15, and a first photoresist layer 21 on the insulating layer;

S42: exposing the first photoresist layer 21 by a first half-tone photomask, and then exposing the first photoresist layer 21 to form a patterned first photoresist layer 21, wherein the patterned first photoresist layer 21 includes a first portion 211 corresponding to a gate portion to be formed in the first metal layer 15, a second portion 212 corresponding to a portion of the touch electrodes to be formed in the common electrode layer, and a first through hole 213 corresponding to a source/drain area of the active layer; and a thickness of the first portion 211 is greater than a thickness of the second portion 212;

S43: using the patterned first photoresist layer 21 as a mask to etch the common electrode layer 14 and the first metal layer 15 by a wet etching process to form a gate electrode;

S44: performing heavy doping on the active layer through the first through hole 213;

S45: ashing the patterned first photoresist layer 21 to thin the first portion 211 and remove the second portion 212;

S46: removing exposed parts of the first metal layer 15 by etching;

S47: removing remaining parts of the first photoresist layer 21; and

S48: performing light doping on the active layer 12.

Wherein, in the step S41 of the embodiment, the common electrode layer 14 and the first metal layer 15 are directly formed on the insulating layer 13 in order, which saves an insulating layer therebetween in comparison with the prior art.

The common electrode layer 14 is a transparent conductive layer. Optionally, the transparent conductive layer is made of indium tin oxide.

During doping process, the first through hole 213 is used as a doping channel of the active layer 12. The first through hole 213 defines a range in which the active layer 12 is doped. The first photoresist layer 21 defines a heavy doping area of the active layer 12. During light doping process, after removing the first photoresist layer 21, a light doping area of the active layer 12 is defined by the patterned common electrode layer 14 and the patterned first metal layer 15.

In step S42, the first half-tone photomask includes a first light transmitting portion and a second light transmitting portion, a light transmittance of the first light transmitting portion is greater than a light transmittance of the second light transmitting portion, the light transmittance of the first light transmitting portion is 100%, the first light transmitting portion is disposed corresponding to the source/drain area of the active layer, and the second light transmitting portion is disposed corresponding to a portion of the touch electrodes to be formed in the common electrode layer 14.

In step S43, the common electrode layer 14 and the first metal layer 15 are etched by a wet etching process to form a gate electrode. A contact area between the gate electrode and the first portion 211 is less than an area of a bottom surface of the first portion 211.

In step S44, a heavy doping of the active layer 12 is a heavy doping of an ohmic contact area of the active layer 12. In this embodiment, since a light shielding layer is saved, during the heavy doping process, a ratio of doping ions will be appropriately adjusted to compensate for a weak electrical property generated by the active layer 12 after being illuminated.

In step S46, exposed parts of the first metal layer 15 are removed by etching to form the patterned first metal layer 15 and the patterned common electrode layer 14. Wherein, since the common electrode layer 14 is located below the first metal layer 15, after the gate electrode is formed, the common electrode layer 14 (a first base portion 142) right under the gate electrode is retained, but such a setting does not affect performance of the gate electrode. Since the common electrode layer 14 and the first metal layer 15 are both made of conductive materials, the first metal layer 15 and the common electrode layer 14 located at a gate position can be regarded as one gate electrode.

In step S48, the active layer 12 is treated by light doping, and a lightly doped area follows boundaries of the gate electrode. In this embodiment, since a light shielding layer is saved, during the light doping process, a ratio of doping ions will be appropriately adjusted to compensate for a weak electrical property generated by the active layer 12 after being illuminated. Then proceed step S5.

In step S5, a patterned protective layer 16 and a patterned pixel electrode layer 17 are formed on the first metal layer 15. The patterned pixel electrode layer 17 includes pixel electrodes 171.

Wherein, the patterned protective layer 16 and the patterned pixel electrode layer 17 are formed on the first metal layer 15 using a same photomask.

Figure 4:
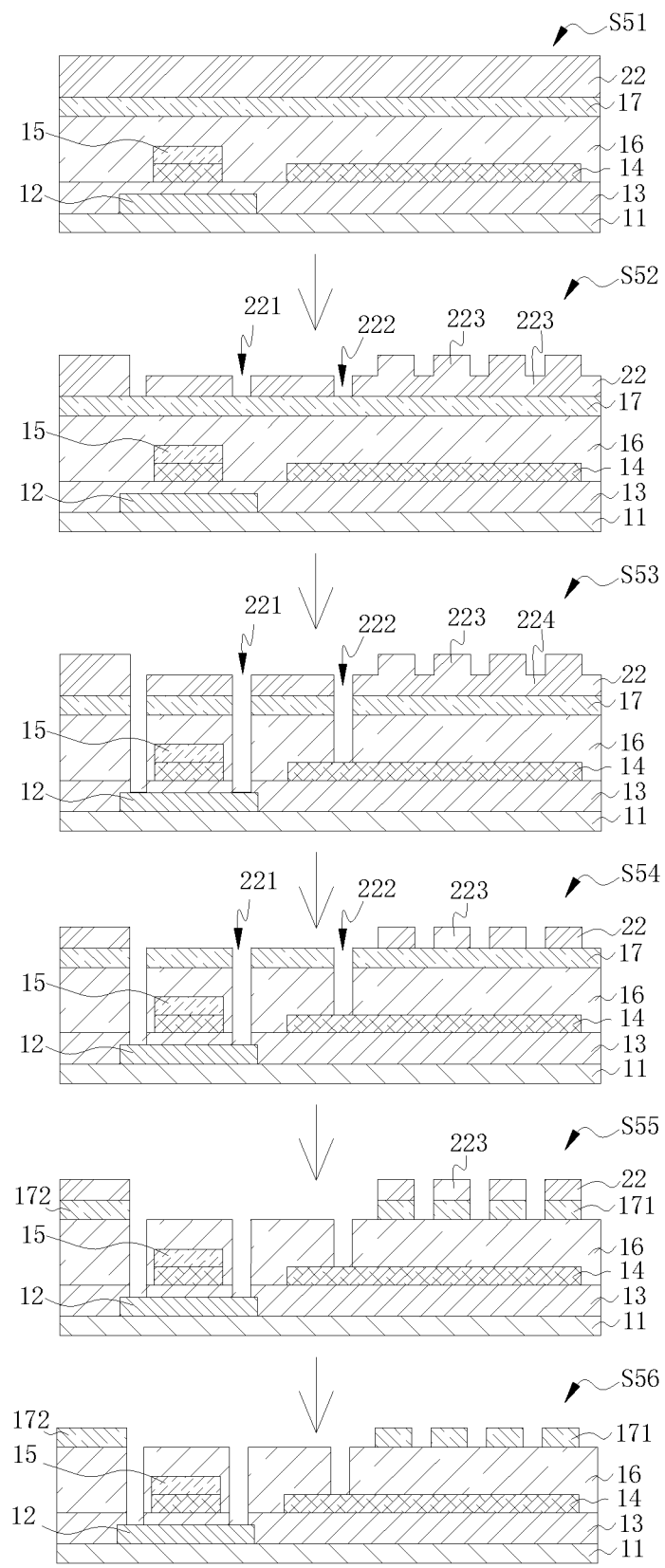
FIG. 4 is a schematic diagram of step S5 of the manufacturing method of the array substrate of the embodiment according to the present disclosure.

Specifically, referring to FIG. 4, it is a schematic diagram of the step S5 of the manufacturing method of the array substrate of the embodiment according to the present disclosure.

The step S5 includes the following steps:

Step S51: sequentially forming a protective layer 16, a pixel electrode layer 17, and a second photoresist layer 22 on the first metal layer 15;

Step S52: exposing the second photoresist layer 22 by a second half-tone photomask, and then exposing the second photoresist layer 22 to form a patterned second photoresist layer 22, wherein the patterned second photoresist layer 22 includes a second through hole 221 corresponding to a source/drain area of the active layer 12, a third through hole 222 corresponding to the touch electrodes, a third portion 223 corresponding to a portion of the pixel electrodes to be formed in the pixel electrode layer 17, and a fourth portion corresponding to a portion to be removed in the pixel electrode layer 17; and a thickness of the third portion 223 is greater than a thickness of the fourth portion 224;

Step S53: using the patterned second photoresist layer 22 as a mask to sequentially etch the pixel electrode layer 17 and the protective layer 16 to expose the source/drain area of the active layer 12 through the second through hole 221 and expose the touch electrodes through the third through hole 222.

Step S54: ashing the patterned second photoresist layer 22 to thin the third portion 223 and remove the fourth portion 224;

Step S55: etching the pixel electrode layer 17 to remove its exposed parts so as to form a patterned pixel electrode layer 17;

Step S56: removing remaining parts of the second photoresist layer 22.

In step S51, the protective layer 16, the pixel electrode layer 17, and the second photoresist layer 22 are sequentially formed on the first metal layer 15, an interlayer dielectric layer and an organic flat layer are saved, the process steps are simplified, and the costs are reduced. It should be noted that, after a deposition of the protective layer 16 is completed, the protective layer 16 performs as a polycrystalline silicon hydrogen supplement layer, that is, after the protective layer 16 is deposited, the active layer 12 is treated with rapid thermal annealing hydrogen activation.

The pixel electrode layer 17 is a transparent conductive layer. Optionally, the transparent conductive layer is made of indium tin oxide.

In step S52, the second half-tone photomask includes a third light transmitting portion and a fourth light transmitting portion, a light transmittance of the third light transmitting portion is greater than a light transmittance of the fourth light transmitting portion, the light transmittance of the third light transmitting portion is 100%, the third light transmitting portion is disposed corresponding to the source/drain area of the active layer and the touch electrodes, and the fourth light transmitting portion is disposed corresponding to parts of the pixel electrode layer 17 to be removed.

In step S53, the pixel electrode layer 17 is etched by a wet etching process to form the pixel electrodes 171 and a second base portion 172 disposed on a same layer as the pixel electrodes 171. The protective layer 16 is etched by a dry etching process. Wherein, the second through hole 221 extends into the insulating layer 13 until the active layer 12 is exposed. Then steps S54-56 are proceed. And then proceed step S6.

In step S6, a patterned second metal layer 18 is formed on the pixel electrode layer 17. The patterned second metal layer 18 includes source electrodes, drain electrodes, and touch signal lines 181. The source electrodes are stacked on the second base portion 172. The drain electrodes are electrically connected to the pixel electrodes. And the touch signal lines 181 are electrically connected to the touch electrodes 141.

In this way, a fabrication of the array substrate of this embodiment is completed.

Figure 5:
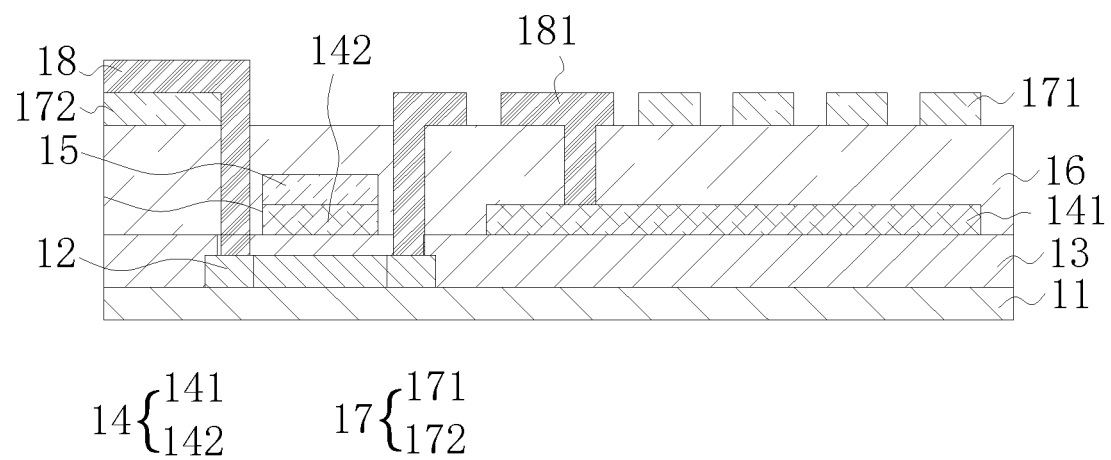
FIG. 5 is a schematic view of an array substrate of an embodiment according to the present disclosure.

Referring to FIG. 5, it is a schematic view of the array substrate of an embodiment according to the present disclosure. The present disclosure also relates to an array substrate. The array substrate includes a substrate 11 and an active layer 12, an insulating layer 13, a common electrode layer 14, a first metal layer 15, a protective layer 16, a pixel electrode layer 17, and a second metal layer 18 that are sequentially disposed on the substrate 11.

Wherein, the pixel electrode layer 17 includes pixel electrodes 171. The second metal layer 18 includes drain electrodes and touch signal lines 181. The common electrode layer 14 includes touch electrodes 141, and the touch electrodes are common electrodes. The drain electrodes are electrically connected to the pixel electrodes, and the touch signal lines 181 are electrically connected to the touch electrodes.

In the array substrate of this embodiment, the common electrode layer 14 further includes a first base portion 142 disposed on a same layer as the touch electrodes 141. The first metal layer 15 is stacked on the first base portion 141.

The pixel electrode layer 17 further includes a second base portion 172 disposed on a same layer as the pixel electrodes 171. The second metal layer 18 is stacked on the second base portion 172.

Compared with the conventional array substrate, the array substrate in this embodiment saves a light shielding layer for shielding the active layer, saves an organic flat layer and an interlayer dielectric layer, simplifies the process, and reduces the costs.

The array substrate in this embodiment is manufactured by the manufacturing method of an array substrate in the above embodiment.

Compared with a conventional array substrate and a conventional manufacturing method of the array substrate, the manufacturing method of the array substrate of the present disclosure uses a same photomask to form a patterned common electrode layer and a patterned first metal layer, which not only saves a photomask, but also saves a light shielding layer; and thereby solving the technical problems of complicated steps, high production costs, and long cycles in the conventional manufacturing method of the touch-integrated array substrate.

As mentioned above, for a person of ordinary skill in the art, various other corresponding changes and modifications can be made according to technical solutions and technical concepts of the present disclosure, and all these changes and modifications should belong to the protection scope of the appendix claims of the present disclosure.

What is claimed is:

1. A manufacturing method of an array substrate, comprising:
   providing a substrate;
   forming a patterned active layer on the substrate;
   forming an insulating layer on the active layer;
   forming a patterned common electrode layer and a patterned first metal layer on the insulating layer using a same photomask, wherein the patterned common electrode layer comprises touch electrodes;
   forming a patterned protective layer and a patterned pixel electrode layer on the first metal layer using a same photomask, wherein the patterned pixel electrode layer comprises pixel electrodes; and
   forming a patterned second metal layer on the pixel electrode layer, wherein the patterned second metal layer comprises drain electrodes and touch signal lines, the drain electrodes are electrically connected to the pixel electrodes, and the touch signal lines are electrically connected to the touch electrodes;
   wherein the step of forming the patterned common electrode layer and the patterned first metal layer on the insulating layer using the same photomask comprises:
   sequentially forming the common electrode layer, the first metal layer, and a first photoresist layer on the insulating layer;
   exposing the first photoresist layer by a first half-tone photomask, and then exposing the first photoresist layer to form a patterned first photoresist layer, wherein the patterned first photoresist layer comprises a first portion corresponding to a gate portion to be formed in the first metal layer, a second portion corresponding to a portion of the touch electrodes to be formed in the common electrode layer, and a first through hole corresponding to a source/drain area of the active layer; and a thickness of the first portion is greater than a thickness of the second portion;
   using the patterned first photoresist layer as a mask to etch the common electrode layer and the first metal layer by a wet etching process to form a gate electrode;
   performing heavy doping on the active layer through the first through hole;
   ashing the patterned first photoresist layer to thin the first portion and remove the second portion;
   removing exposed parts of the first metal layer by etching;
   removing remaining parts of the first photoresist layer; and
   performing light doping on the active layer.

2. The manufacturing method of the array substrate as claimed in claim 1, wherein the first half-tone photomask comprises a first light transmitting portion and a second light transmitting portion, a light transmittance of the first light transmitting portion is greater than a light transmittance of the second light transmitting portion, the light transmittance of the first light transmitting portion is 100%, the first light transmitting portion is disposed corresponding to the source/drain area of the active layer, and the second light transmitting portion is disposed corresponding to a portion of the touch electrodes to be formed in the common electrode layer.

3. The manufacturing method of the array substrate as claimed in claim 1, wherein the step of forming the patterned protective layer and the patterned pixel electrode layer on the first metal layer using the same photomask comprises:
   sequentially forming the protective layer, the pixel electrode layer, and a second photoresist layer on the first metal layer;
   exposing the second photoresist layer by a second half-tone photomask, and then exposing the second photoresist layer to form a patterned second photoresist layer, wherein the patterned second photoresist layer comprises a second through hole corresponding to the source/drain area of the active layer, a third through hole corresponding to the touch electrodes, a third portion corresponding to a portion of the pixel electrodes to be formed in the pixel electrode layer, and a fourth portion corresponding to a portion to be removed in the pixel electrode layer; and a thickness of the third portion is greater than a thickness of the fourth portion;
   using the patterned second photoresist layer as a mask to sequentially etch the pixel electrode layer and the protective layer to expose the source/drain area of the active layer through the second through hole and expose the touch electrodes through the third through hole;

ashing the patterned second photoresist layer to thin the third portion and remove the fourth portion;

etching the pixel electrode layer to remove its exposed parts so as to form the patterned pixel electrode layer; and removing remaining parts of the second photoresist layer.

4. The manufacturing method of the array substrate as claimed in claim 3, wherein the second half-tone photomask comprises a third light transmitting portion and a fourth light transmitting portion, a light transmittance of the third light transmitting portion is greater than a light transmittance of the fourth light transmitting portion, the light transmittance of the third light transmitting portion is 100%, the third light transmitting portion is disposed corresponding to the source/drain area of the active layer and the touch electrodes, and the fourth light transmitting portion is disposed corresponding to parts of the pixel electrode layer to be removed.

5. The manufacturing method of the array substrate as claimed in claim 3, the step of using the patterned second photoresist layer as the mask to sequentially etch the pixel electrode layer and the protective layer comprises etching the pixel electrode layer by a wet etching process and etching the protective layer by a dry etching process.

6. A manufacturing method of an array substrate, comprising:
providing a substrate;
forming a patterned active layer on the substrate;
forming an insulating layer on the active layer;
forming a patterned common electrode layer and a patterned first metal layer on the insulating layer using a same photomask, wherein the patterned common electrode layer comprises touch electrodes;
forming a patterned protective layer and a patterned pixel electrode layer on the first metal layer, wherein the patterned pixel electrode layer comprises pixel electrodes; and
forming a patterned second metal layer on the pixel electrode layer, wherein the patterned second metal layer comprises drain electrodes and touch signal lines, the drain electrodes are electrically connected to the pixel electrodes, and the touch signal lines are electrically connected to the touch electrodes.

7. The manufacturing method of the array substrate as claimed in claim 6, wherein the step of forming the patterned common electrode layer and the patterned first metal layer on the insulating layer using the same photomask comprises:
sequentially forming the common electrode layer, the first metal layer, and a first photoresist layer on the insulating layer;
exposing the first photoresist layer by a first half-tone photomask, and then exposing the first photoresist layer to form a patterned first photoresist layer, wherein the patterned first photoresist layer comprises a first portion corresponding to a gate portion to be formed in the first metal layer, a second portion corresponding to a portion of the touch electrodes to be formed in the common electrode layer, and a first through hole corresponding to a source/drain area of the active layer; and a thickness of the first portion is greater than a thickness of the second portion;
using the patterned first photoresist layer as a mask to etch the common electrode layer and the first metal layer by a wet etching process to form a gate electrode;

performing heavy doping on the active layer through the first through hole;
ashing the patterned first photoresist layer to thin the first portion and remove the second portion;
removing exposed parts of the first metal layer by etching;
removing remaining parts of the first photoresist layer; and
performing light doping on the active layer.

8. The manufacturing method of the array substrate as claimed in claim 7, wherein the first half-tone photomask comprises a first light transmitting portion and a second light transmitting portion, a light transmittance of the first light transmitting portion is greater than a light transmittance of the second light transmitting portion, the light transmittance of the first light transmitting portion is 100%, the first light transmitting portion is disposed corresponding to the source/drain area of the active layer, and the second light transmitting portion is disposed corresponding to a portion of the touch electrodes to be formed in the common electrode layer.

9. The manufacturing method of the array substrate as claimed in claim 6, wherein the patterned protective layer and the patterned pixel electrode layer are formed on the first metal layer using a same photomask.

10. The manufacturing method of the array substrate as claimed in claim 9, wherein the step of forming the patterned protective layer and the patterned pixel electrode layer on the first metal layer using a same photomask comprises:
sequentially forming the protective layer, the pixel electrode layer, and a second photoresist layer on the first metal layer;
exposing the second photoresist layer by a second half-tone photomask and then exposing the second photoresist layer to form a patterned second photoresist layer, wherein the patterned second photoresist layer comprises a second through hole corresponding to a source/drain area of the active layer, a third through hole corresponding to the touch electrodes, a third portion corresponding to a portion of the pixel electrodes to be formed in the pixel electrode layer, and a fourth portion corresponding to a portion to be removed in the pixel electrode layer; and a thickness of the third portion is greater than a thickness of the fourth portion;
using the patterned second photoresist layer as a mask to sequentially etch the pixel electrode layer and the protective layer to expose the source/drain area of the active layer through the second through hole and expose the touch electrodes through the third through hole;
ashing the patterned second photoresist layer to thin the third portion and remove the fourth portion;
etching the pixel electrode layer to remove its exposed parts so as to form the patterned pixel electrode layer; and
removing remaining parts of the second photoresist layer.

11. The manufacturing method of the array substrate as claimed in claim 10, wherein the second half-tone photomask comprises a third light transmitting portion and a fourth light transmitting portion, a light transmittance of the third light transmitting portion is greater than a light transmittance of the fourth light transmitting portion, the light transmittance of the third light transmitting portion is 100%, the third light transmitting portion is disposed corresponding to the source/drain area of the active layer and the touch electrodes, and the fourth light transmitting portion is disposed corresponding to parts of the pixel electrode layer to be removed.

12. The manufacturing method of the array substrate as claimed in claim 10, the step of using the patterned second photoresist layer as the mask to sequentially etch the pixel electrode layer and the protective layer comprises etching the pixel electrode layer by a wet etching process and etching the protective layer by a dry etching process.

13. An array substrate, comprising:
a substrate;
an active layer;
an insulating layer;
a common electrode layer;
a first metal layer;
a protective layer;
a pixel electrode layer; and
a second metal layer;
wherein the active layer, the insulating layer, the common electrode layer, the first metal layer, the protective layer, the pixel electrode layer, and the second metal layer are sequentially disposed on the substrate; the pixel electrode layer comprises pixel electrodes; the second metal layer comprises drain electrodes and touch signal lines; the common electrode layer comprises touch electrodes; the drain electrodes are electrically connected to the pixel electrodes; and the touch signal lines are electrically connected to the touch electrodes.

14. The array substrate as claimed in claim 13, wherein the common electrode layer further comprises a first base portion disposed on a same layer as the touch electrodes, and the first metal layer is stacked on the first base portion.

15. The array substrate as claimed in claim 13, wherein the pixel electrode layer further comprises a second base portion disposed on a same layer as the pixel electrodes, the second metal layer comprises source electrodes, and the source electrodes are stacked on the second base portion.

* * * * *